United States Patent [19]

Senor

[11] 4,410,231

[45] Oct. 18, 1983

[54] INTEGRATED CIRCUIT MOUNTING SOCKET

[75] Inventor: Ronald E. Senor, North Attleboro, Mass.

[73] Assignee: Texas Instruments Incorporated, Dallas, Tex.

[21] Appl. No.: 300,077

[22] Filed: Sep. 8, 1981

[51] Int. Cl.$^3$ .............................. H01R 13/405
[52] U.S. Cl. .................... 339/218 M; 339/17 CF
[58] Field of Search ......... 339/17 CF, 176 M, 218 R, 339/218 M

[56] References Cited

U.S. PATENT DOCUMENTS

| | | | |
|---|---|---|---|
| 3,494,998 | 2/1970 | Anhalt | 339/218 R |
| 3,512,121 | 5/1970 | Bergeron | 339/218 R |
| 3,854,788 | 12/1974 | Goodman | 339/17 CF |
| 4,052,117 | 10/1977 | Tengler et al. | 339/17 CF |
| 4,060,296 | 11/1977 | Kunkle et al. | 339/17 CF |

Primary Examiner—John McQuade
Attorney, Agent, or Firm—James P. McAndrews; John A. Haug; Melvin Sharp

[57] ABSTRACT

A connector or socket for detachably mounting an integrated circuit unit on a printed circuit board has single beam contact members precisely located and secured in respective recesses in an electrically insulating body by guiding wing portions of the contacts against shaped body portions which are then deformed over the wing contact portions to secure the contacts in the recesses. The contact members are formed of a strip material and each have a base with lateral wing portions, a spring beam part extending up from one end of the base to loop over the base, and a post part extending down from the opposite end of the base, the beam and post parts each preferably having a stiffening rib formed therein and extending into the base part to assure that the contact parts have a desired angular relationship to each other. The connector body has recesses which are open at their bottom end to freely receive the looped contact portions therein, has locating steps in the open bottom ends of the recesses, and has tapered tower portions between the recesses to engage and guide the wing contact portions against the locating steps and to be deformed over the wings for securing the contacts in the recesses. The body has tapered apertures of novel configuration communicating with the opposite ends of the recesses to provide versatile and more reliable guiding of i.c. terminals into engagement with the contact while providing improved terminal insertion, terminal contacting and terminal withdrawal force characteristics.

9 Claims, 6 Drawing Figures

INTEGRATED CIRCUIT MOUNTING SOCKET

BACKGROUND OF THE INVENTION

Dual-in-line integrated circuit units are conventionally mounted on printed circuit boards by the use of connectors or sockets having resilient contacts which are soldered to the p.c. boards in position to make detachable electrical connection to the i.c. terminals. Each contact is formed of a solderable, electrically conductive metal spring material and is secured in a recess in an electrically insulating connector body so that a post part of the contact extending from the bottom of the recess is easily fitted into a selected opening in a p.c. board to be soldered to a circuit path on the board and so that an i.c. terminal is easily inserted into the top of the recess to be detachably engaged with the contact. However, the cost of such connectors is becoming an increasingly more significant part of the overall cost of printed circuit board assemblies and the nature and character of the connectors is becoming an important factor in determining the cost of panel board assembly and in determining the reliability and versatility achieved by the printed circuit panels. In that regard, it would be desirable to reduce the cost of the components used in such components to provide a connector structure. It would also be desirable to provide such a connector structure which is easily mounted on a p.c. board, which is adapted to receive different types of i.c. terminals with greater ease and versatility, and which provides greater ease and reliability in detachably mounting i.c. units on the p.c. board.

SUMMARY OF THE INVENTION

It is an object of this invention to provide a novel and improved connector for mounting integrated circuit units on a printed circuit board; to provide such a connector incorporating low cost, high quality single beam contacts formed from strip materials; to provide a connector in which such contacts are more easily and accurately positioned and received in recesses in a connector body to facilitate soldering of the contacts to a printed circuit board and to facilitate detachable engagement of integrated circuit terminals with the contacts; and to provide a connector in which the connector body has an improved low profile, has improved freedom from warping, and has recesses with an improved entry configuration to receive i.c. terminals of various widths and lengths with improved insertion force, terminal engagement, and withdrawal force characteristics.

Briefly described, the novel and improved connector of this invention comprises a connector body molded of a heat-deformable electrically insulating material such as a glass-filled polyester or the like and also includes a plurality of contact members which are formed from a strip of solderable, electrically conductive metal spring material.

Each contact member has base part of a generally flat configuration having a wing extending laterally from each side of the base and preferably having an arc shape formed in the distal end of the wing. A single beam, spring part of the contact member extends up from one end of the base to loop over the base and a post part of the member extends down from the opposite end of the base. Preferably the spring and post parts of the member each have a stiffening rib formed therein by deformation of the strip material to extend into the base part of the member, thereby to cooperate in positioning and holding the spring and post parts of the contact in a desired angular relationship to the base and to each other. In that way, the contact members are of an inexpensive construction but are adapted to be formed with consistent mechanical properties and proportions.

The connector body preferably comprises a pair of spaced body sections which are secured in parallel relation to each other by a single pair of ribs extending between the sections. Each section has a plurality of recesses located in a line therein and each recess is fully open at the bottom side of the section. The recess walls are of substantially the same thickness so that any tendency for the body to warp during temperature change is substantially reduced. Shoulders or steps are formed in the body at each side of each recess at the fully opened end of the recess to face out from the bottom side of the connector body. The connector as originally formed has tower shaped, tapered portions, preferably of an ogival configuration or the like, extending down from the bottom of the body so that a tower portion is located between each pair of body recesses and at each end of each line of the body recesses. The tower portions are positioned so that they taper into and intercept the steps or shoulders as formed in the recesses as noted above. The looped spring parts of the contact members are inserted into the body recesses through the open bottom ends of the recesses so that the arcuate ends of the contact wings engage and are guided along the shaped tower portions of the body to rest against the noted recess shoulders in precisely predetermined positions. The tower shaped portions of the body are then deformed over the wing portions of the contact members in their desired recess locations. In that way the contact members are precisely positioned and secured in the respective body recesses so that the lateral edges of the looped spring parts do not have any interfering engagement with the recess walls. However the looped spring parts of the contact members are proportioned so that the portions of the spring parts with stiffening ribs therein which extend up from the base parts of the contact rest against the inner walls of the respective body recesses while the distal ends of the looped spring beam parts engage the outer walls of the respective recesses with a predetermined force.

The top of the connector body is flat and a plurality of terminal entry apertures open into the respective body recesses through the top of the body. A pair of guide surfaces are provided in the top of the body to extend in spaced relation to each other along each body section adjacent the outer edge of the section. The guide surfaces of each pair taper into the body and toward each other to intercept each of the terminal entry apertures. Each entry aperture has a first part at a location adjacent the outer recess wall which extends the full width of the body recess. Each entry aperture has a second part of relatively smaller width which extends centrally from the first part of the aperture to approximately the center of the noted recess. In that arrangement, integrated circuit units of different proportions are easily received on the flat top of the connector body; i.c. terminals are readily engaged with the loop spring parts of the respective contact members through the second parts of the terminal entry apertures; the tapered guide surfaces provided in the top of the connector body do not require any increase in connector body profile but cooperate in guiding the i.c. terminals into the entry apertures; relatively low i.c.

terminal insertion forces are required for sliding the i.c. terminals along the looped parts of the single beam contacts into the body recesses so that the terminals are held with substantial force between the distal ends of the spring beam parts and the outer walls of the recesses; and substantial terminal withdrawal forces are required for withdrawing the terminals from such engagement with the contacts. If the i.c. units have terminals of relatively short length such that it is desirable to depress i.c. terminals to assure proper penetration of the connector body recesses, the larger, first parts of the entry apertures are adapted to accommodate any wider shoulder portions of the i.c. terminals.

DESCRIPTION OF THE DRAWINGS

Other objects, advantages, and details of the novel and improved connector of this invention appear in the following detailed description of preferred embodiments of the invention, the detailed description referring to the drawings in which.

DESCRIPTION OF THE PREFERRED EMBODIMENT

Figure 1:
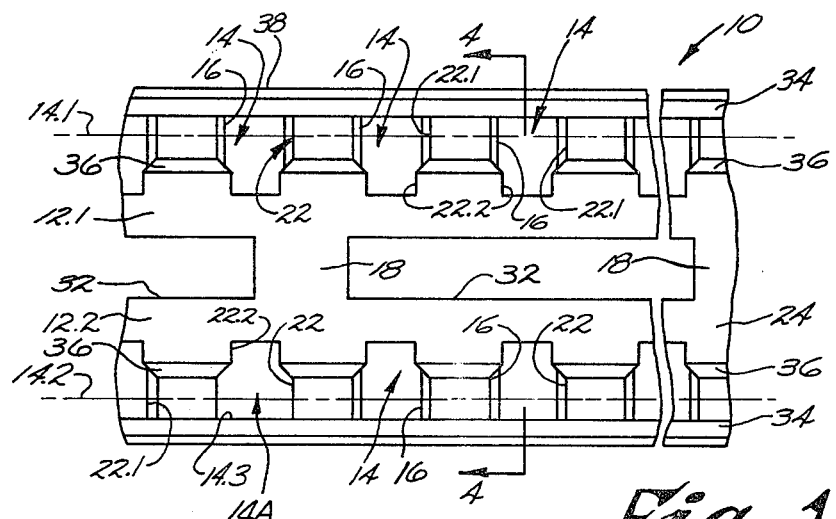
FIG. 1 is a plan view of the novel connector provided by this invention.

Referring to the drawings, 10 in FIGS. 1-4 indicates the novel and improved connector of this invention which is shown to include a connector body 12 having a plurality of recesses 14 (See FIG. 1) located therein and having a plurality of contact members 16 mounted in the respective recesses by selected deformation of portions of the connector body. For simplicity of illustration, FIGS. 1-4 illustrate portions of the connector body before and after deformation thereof and illustrate one body recess 14A See FIGS. 2-4 with a contact member 16 omitted therefrom while showing contact members secured in the other body recesses by selected deformation of portions of the body.

In the connector of this invention, the connector body 12 comprises a body of deformable, electrically insulating material such as glass-filled polyester or the like. The body material is selected so that the body has substantial rigidity to be strong and shape retaining during conditions of normal use but so that portions of the body are adapted selectively deformed by the application of heat or pressure or by ultrasonic fusing or the like as described below. The connector body 12 is preferably formed with two sections 12.1 and 12.2 held in spaced relation to each other by a single pair of ribs 18 extending between the body sections. Groups of the recesses 14 are located in lines 14.1 and 14.2 (See FIG. 1) extending along the lengths of the respective sections. The body recesses 14 are each open at a bottom 20 of the body as shown particularly in FIG. 2 and terminal entry apertures 22 are arranged to open into the respective recesses through the top 24 of the connector body. The body sections are preferably proportioned as illustrated at 14B in FIG. 3 so that each wall of each of the recesses has substantially the same thickness, thereby to provide the body with improved freedom from warping when exposed to temperature or humidity changes.

The connector body provides steps 26 in each of the recesses 14 located at opposite sides of the recesses adjacent to the bottom 20 of the connector body and facing outwardly from the recesses. In accordance with this invention, the connector body also has tower portions 28 which extend down from the bottom of the body between each pair of the recesses 14 and which also extend down from the body at the end of each of the lines of recesses 14.1 and 14.2. When a connector body is originally formed, the tower portions 28 are shaped or tapered as illustrated at 28A in FIGS. 2-4, preferably having an ogival shape or the like as shown. The tower portions are arranged so they extend into the recesses 14 and intercept the recess steps 26 as shown particularly in FIGS. 2 and 3. Preferably, the bottom of the connector body is also provided with spacer bosses 30, and notches 32 (See FIG. 1) are provided in the body ribs for a purpose to be noted below.

In accordance with this invention, the top 24 of the connector body 12 is generally flat and has a pair of guide surfaces 34 and 36 which extend along the length of each body section adjacent the outer edge 38 of the section in spaced parallel relation to each other. The guide surfaces of each pair taper into the body and taper toward each other as is best known in FIGS. 1 and 4 to intercept each of the terminal entry apertures 22 in one of the lines 14.1 or 14.2 of the body recesses. In accordance with this invention, each of the terminal entry apertures 22 has a first part 22.1 which opens into a respective recess 14 adjacent a first wall 14.3 (see FIG. 1) of the body recess at the outer side of the connector body. As is best shown at 14.4 in FIG. 3, the first part 22.1 of the entry aperture extends across the full width of the recess 14. Each terminal entry aperture 22 also has a second part 22.2 of lesser width which extends centrally from the first part of the aperture into approximately the center of the recess 14. Preferably the top of the connector body inside each recess 14 is beveled or tapered toward the aperture 22 as indicated at 14.5 and 14.6 in FIGS. 2-4, thereby to center contact member 16 inserted into the recesses 14.

Figure 5:
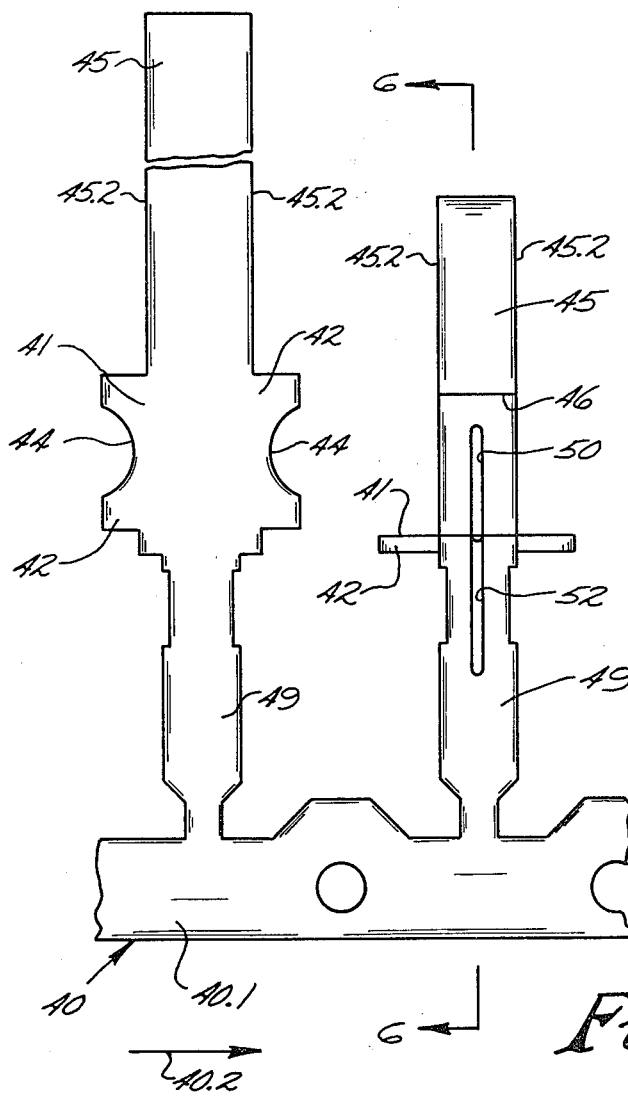
FIG. 5 is a side elevation view to enlarged scale of a strip of material used in forming contact members incorporated in the connector of this invention, the view illustrating steps in making of the contact members.
Figure 6:
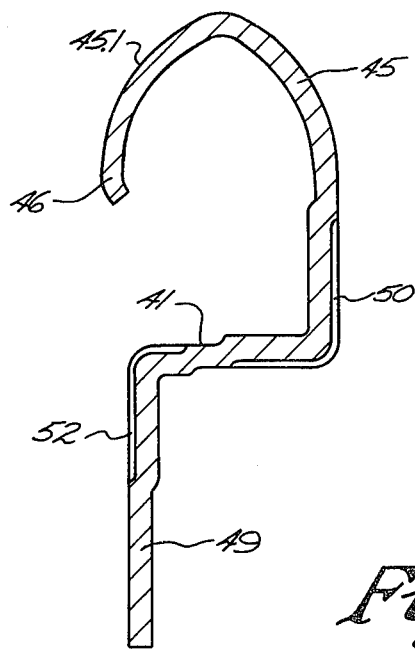
FIG. 6 is a partial section view along line 6—6 of FIG. 5 providing a longitudinal view through the contact member in the connector of this invention

In accordance with this invention, the contact members 16 are formed by blanking the members from a thin strip of solderable, electrically conductive, metal spring material such as phosphor bronze or the like. Preferably as is diagrammatically illustrated in FIG. 5, the contact members 16 are blanked and progressively shaped from a metal strip 40 while retained attached to a skeleton or support portion 40.1 of the strip as the strip is advanced through progressive dies in a conventional manner as is diagramically illustrated by the arrow 40.2 in FIG. 5. In that regard, each of the contact members is formed with a generally flat base part 41 which is provided with a wing 42 extending laterally from each side of the base. The wing preferably has an arcuate shape 44 formed therein at the distal end of the wing as is best shown in FIG. 5. The contact member is also provided with a spring beam part 45 which extends upwardly from one end of the base 41 to loop over the base part so that the distal end 46 of the spring beam is directed down toward the opposite end of the base. The contact member is also formed with a post part 49 extending downwardly from the opposite end of the base part. In the preferred embodiment of the invention, the strip material 40 embodied in the contact member is deformed to provide a stiffening rib 50 therein to extend into the base part and into a portion of the spring part of the contact member, thereby to position and hold the spring and base parts of the member in a desired angular relation to each other. Preferably a similar stiffening rib 52 is formed in the strip material extending into the base and into the post part of the member to hold the base and post part member in a desired angular relation to each other.

In accordance with the invention, the looped spring beam parts 45 of the contact members 16 are proportioned to fit snugly into the body recesses 14 so that the distal ends 46 of the spring beam parts bear against the first recess walls 14.3 with selected predetermined force. That is, the loop 45 is oversized to a selected degree with respect to the recess 14 and accordingly, when the loop contact part 45 is fitted into the recess, the spring is pre-stressed to a selected degree. However the arcuate shapes 44 of the contact base wings are engaged with the ogival shaped tower portions 28A of the body so that, when the base wings 42 are engaged with the recess steps 26, the contact is located in a predetermined position in the recess. Further, the stiffening rib 50 formed in the base and spring parts of the member assures that the base and spring parts of the contact have the desired angular relationship to each other. Accordingly, the pre-stress of the spring part 45 is properly applied against the recess wall 14.3 by the distal end 46 of the spring with a consistently predetermined force. The tower portions 28 of the body are then deformed over the contact wings 42 by the application of heat or pressure or by ultrasonic fusing or the like in any conventional manner as is best indicated at 28B in FIG. 4, thereby to secure the base wings 42 firmly against the recess steps 26. The stiffening rib 52 in the base and post parts of the contact members then assures that the post part 49 of the contact member extends from the connector body recess 14 at the proper angle to be readily received in a hole 54 in a printed circuit board 56 as is diagrammatically illustrated in FIG. 4.

Figure 2:
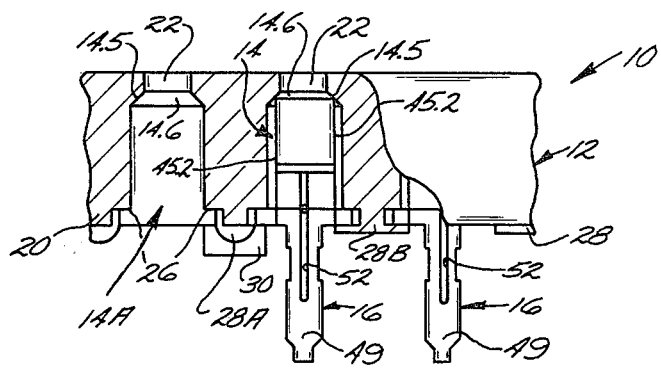
FIG. 2 is a partial side elevation view, partially in section, of the connector shown in FIG. 1.
Figure 3:
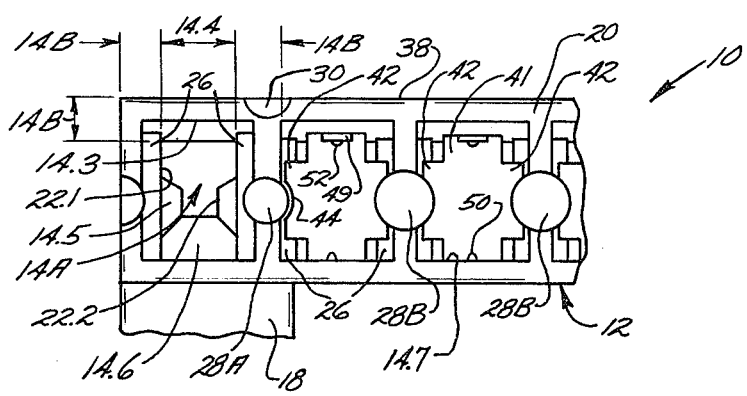
FIG. 3 is a partial bottom view of the connector shown in FIGS. 1 and 2.
Figure 4:
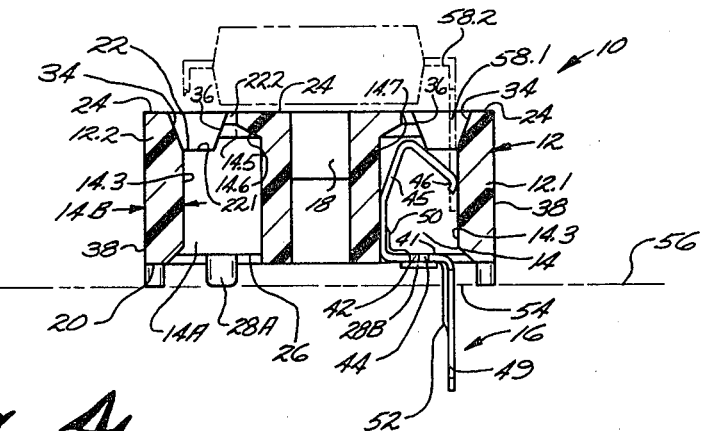
FIG. 4 is a section view along line 4—4 of FIG. 1.

In that way the connector 10 is adapted to receive an integrated circuit 58 (See FIG. 4) of any conventional proportions on the flat top surface 24 of the connector body (see FIG. 4). The small i.c. terminals 58.1 of the unit are easily guided into the terminal entry apertures 22 by the tapered guide surfaces 34 or 36 which serve their desired function without adding unnecessary height to the connector body profile. The tip of the terminal is consistently engaged with the downturn portion 45.1 of the looped spring part as the terminal is inserted into the entry aperture part 22.2 to slide down against the recess wall 14.3 at the proper side of the contact 16. The distal end 46 of the spring is free to move downwardly to permit the terminal to be easily inserted with low insertion force between the distal end 46 of the spring and the first or outer recess wall 14.3, thereby to reduce risk of any terminal damage. The positioning of the contact members 16 in the recesses 14 as above described assures that the lateral edges 45.2 of the contact spring parts (See FIG. 5) are free to move without interference with the walls of the recesses 14 as is best illustrated in FIG. 2. The spring part 45 applies a substantial contact pressure to the terminal 58.1 to assure that good electrical connection is more to the terminal. The arrangement of the stiffening rib 50 in a portion of the spring part 45 to rest against an inner or second wall 14.7 (See FIG. 3) of the recess 14 assures that, when the terminal 58.1 is withdrawn from the aperture 22, the spring 45 maintains substantial force on the terminal during the withdrawal to avoid inadvertent dismounting of the i.c. unit. If the small i.c. terminals are relatively short so that the terminals are pressed downwardly to assure good electrical connections, the wider parts 22.1 of the terminal entry apertures assure that the usually wider terminal shoulder portions 58.2 are readily accommodated in the entry apertures 22. Thus, the connector 10 applies only low force to terminals being inserted to emit easy insertion with reduced risk of terminal damage; assures that the terminal is properly positioned between the contact and the recess wall in the connector body; applies good contact force to make reliable electrical connection between the contact and the terminal; and maintains good withdrawal forces to assure secure integrated circuit mounting.

It should be understood that although preferred embodiments of the connector have been described to illustrate this invention, the connector includes all modifications and equivalents of the described embodiments falling within the scope of the appended claims.

I claim:

1. A connector for mounting integrated circuit units on a printed circuit board comprising a body of deformable electrically insulating material having a plurality of recesses arranged in a line therein and a plurality of electrically conductive metal spring contact members mounted in the respective recesses, said body having said recesses open at one end at a bottom of the body, having steps formed in the recesses at opposite sides of the open recess ends facing outwardly from the recesses, and having terminal entry apertures opening into the opposite ends of recesses through a top of the body, said contact members each having a base part resting on the steps in a respective recess, having a single beam spring part extending up into the recess from one end of the base to loop over the base to resiliently dispose a distal end of the spring part at a selected recess location, and having a post part extending down out of the open recess end from the opposite end of the base part, said body having deformed portions securing the contact members in said recesses, characterized in that the connector body has tower portions formed therein so that respective tower portions extend from the bottom of the body between each pair of said recesses and from each end of said line of recesses adjacent the open recess ends, said tower portions being tapered to extend into the recesses to intercept said recess steps, the base parts of the contact members each having a wing extending from each side thereof and having an arcuate shape formed in the distal end of each wing, said arcuate wing ends being fitted against respective steps in said recesses around respective tower portions intercepting said steps for precisely locating the contact members in said recesses with the distal ends of said contact spring beam parts each resiliently disposed at said selected locations for engaging another means with a selected force, and said tower portions of the body being deformed over said wing portions of the base part for securing the contact members in said positions in the recesses.

2. A connector according to claim 1 further characterized in that the contact member wings cooperate with said tapered tower portions in positioning the contact members in respective body recesses so that the spring beam parts of the contact members are movable in the recesses free from engagement of the lateral edges of the spring beam parts with walls of the recesses.

3. A connector according to claim 2 further characterized in that each of the contact members embodies a metal strip material having a deformed portion forming a stiffening rib therein which extends into portions of the base part and of the spring beam part of the member for holding the spring beam part in a selected angular relation to the base part of the member.

4. A connector according to claim 3 further characterized in that each of the contact members has an additional deformed portion of the strip material forming a stiffening rib which extends into portions of the base part and of the post part of the member for holding the post part in a selected angular relation to the base part of the member.

5. A connector according to claim 2 further characterized in that the connector body has a pair of sections each having a line of said recesses therein, said sections being secured in selected space relation to each other by a single pair of integral body ribs, said body sections providing each wall of each of said recesses with substantially the same thickness for enhancing freedom from warping of the body during temperature change.

6. A connector according to claim 5 further characterized in that the top of the connector body is substantially flat, a pair of guiding surfaces extend in spaced parallel relation to each other along the length of each section of the connector body, and the guiding surfaces taper into the body and toward each other to intercept each of the terminal entry apertures opening into a line of said body recesses.

7. A connector according to claim 6 further characterized in that each of said terminal entry apertures has a first part opening into a recess adjacent a first wall of the recess extending across the full width of the recess and adjacent the distal ends of said spring part at said selected recess location, and has a second part of lesser width extending centrally from the first part of the aperture into approximately the center of the recess.

8. A connector according to claim 7 further characterized in that each of the contact members embodies a metal strip material having a deformed portion forming a stiffening rib therein extending into portions of the base part and of the spring beam part of the member for holding the spring beam part in a selected angular relation to the base part of the member.

9. A connector according to claim 8 further characterized in that each of the contact members has an additional deformed portion of the strip material forming a stiffening rib therein extending into portions of the base part and of the post part of the member for holding the post part in a selected angular relation to the base part of the member.

* * * * *